United States Patent
Li et al.

(10) Patent No.: US 7,854,365 B2
(45) Date of Patent: Dec. 21, 2010

(54) DIRECT DIE ATTACH UTILIZING HEATED BOND HEAD

(75) Inventors: Ming Li, Kwai Chung (HK); Ying Ding, Kwai Chung (HK); Ping Liang Tu, Kwai Chung (HK); King Ming Lo, Kwai Chung (HK); Kwok Kee Chung, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 116 days.

(21) Appl. No.: 12/258,675

(22) Filed: Oct. 27, 2008

(65) Prior Publication Data

US 2010/0105172 A1    Apr. 29, 2010

(51) Int. Cl.
*B23K 31/02* (2006.01)
(52) U.S. Cl. .............. 228/180.21; 228/180.22; 228/214; 228/215
(58) Field of Classification Search ........... 228/214, 228/215, 180.21, 180.22
See application file for complete search history.

(56) References Cited

U.S. PATENT DOCUMENTS

| | | | | |
|---|---|---|---|---|
| 6,131,795 A | * | 10/2000 | Sato | ............ 228/102 |
| 6,386,429 B1 | * | 5/2002 | Sani-Bakhtiari et al. | . 228/180.1 |
| 6,585,853 B2 | * | 7/2003 | Kitaguchi | ............ 156/580.1 |
| 7,632,710 B2 | * | 12/2009 | Sakai et al. | ............ 438/108 |
| 2005/0098610 A1 | * | 5/2005 | Onobori et al. | ........ 228/180.21 |
| 2006/0076388 A1 | * | 4/2006 | Sato | ............ 228/102 |
| 2009/0155958 A1 | * | 6/2009 | Kolodin et al. | ............ 438/120 |

FOREIGN PATENT DOCUMENTS

| | | | |
|---|---|---|---|
| JP | 05055635 A | * | 3/1993 |
| WO | WO 2007055410 A1 | * | 5/2007 |

OTHER PUBLICATIONS

English computer translation of JP 05-055635.*
Dictionary.com; Random House Dictionary; "Blow".*

* cited by examiner

*Primary Examiner*—Jessica L Ward
*Assistant Examiner*—Erin B Saad
(74) *Attorney, Agent, or Firm*—Ostrolenk Faber LLP

(57) ABSTRACT

A method is provided for bonding a die comprising a solder layer which has a melting point Tm. A bond head is heated to a bond head setting temperature T1, which is higher than Tm, and a substrate is heated to a substrate setting temperature T2, which is lower than Tm. The bond head then picks up the die and heats the die towards temperature T1 so as to melt the solder layer. The solder layer of the die is pressed onto the substrate so as to bond the die to the substrate, and thereafter the bond head is separated from the die so that the solder layer is cooled towards T2 and solidifies.

14 Claims, 3 Drawing Sheets

DIRECT DIE ATTACH UTILIZING HEATED BOND HEAD

FIELD OF THE INVENTION

The invention relates to the bonding of semiconductor dice or chips, such as light-emitting diodes (LEDs), onto a substrate.

BACKGROUND AND PRIOR ART

For die bonding during the assembly of electronic packages, a robust die attach process is critical to achieve low electrical resistance, low thermal resistance and good mechanical and electrical integrity. The existing die bonding processes for High Brightness LED (HBLED) devices typically involve silver (Ag) epoxy bonding, gold-tin (AuSn) eutectic bonding, thermosonic (TS) bonding with gold (Au) studs or solder reflow with solder bumps for flip chip bonding. Although silver epoxy bonding is a simple and mature process, its low thermal conductivity has limited its application in high power applications. The flip chip structure has the drawback of having a relatively small contact area for effective heat dissipation. Among these die bonding methods, gold-tin eutectic bonding offers the advantages of low thermal resistance and a relatively large contact area which are especially beneficial for power device applications. During chip fabrication, an 80% gold/20% tin eutectic metal layer is deposited on the bottom of the chip. The melting temperature of this metal layer is typically about 280° C.

For gold-tin eutectic die attachment, there are currently two possible approaches, namely flux eutectic die attach and direct eutectic die attach. During flux eutectic die attachment, a small volume of flux is placed on the package substrate, and the LED is placed onto the flux. After that, the substrate with multiple LEDs mounted on it will be put into the reflow oven to complete the bonding. There is no external force applied throughout the process. The advantage of this method is that no squeeze-out of the die attach metal occurs. However, there are some problems which retard the effectiveness of the process. Of most concern is flux residue, which might lead to package reliability issues due to moisture corrosion. Furthermore, chip movement including die tilting and die rotation cannot be avoided due to the difficulty of controlling the flux dispensing volume and uniformity with precision. Insufficient flux induces non-wetting of the gold-tin material, but using too much flux causes poor wetting of the gold-tin material and affects placement accuracy.

Direct eutectic die attach involves preheating the substrate to 300-320° C. in an ambient chamber with shielding gas, then an LED is picked by a bond head collet and placed onto the heated substrate with a compression force. After a certain time (about 100 to 200 ms), the contact force is released. Initially in this process, the gold-tin eutectic layer will be in a molten state on the substrate. After the substrate bond pad materials (gold, silver, palladium, etc.) dissolve into the molten gold-tin layer, and reach the saturation limit at this temperature, solidification will occur due to the high melting point of the off-eutectic composition. As a result, the LED is bonded on the substrate by the gold-tin eutectic material. Since an external force is utilized during the said LED die attachment, and no flux is needed during this process, the bonding performance has been found to be more encouraging as compared to flux eutectic die attachment.

However, two issues have emerged recently for direct die attachment during the manufacture of HBLED devices. Firstly, due to the slow solidification rate of the thick gold-tin layer, the squeezed out solder tends to flow back after the bond head is removed from the chip surface, and voids may appear at the interface between LED and the substrate after bonding. The voids are unacceptable, since the reliability of packaged electronics strongly depends on the die attach quality, and any void or a small delamination may cause instant temperature increase in the die, leading sooner or later to failure in the package. More importantly, with the increase of substrate size, the number of the units to be bonded onto each substrate reaches several hundreds or even over one thousand units. It will take a significant amount of time to finish bonding LEDs onto the whole substrate, and the LEDs already bonded will endure a longer annealing time on the heated substrate, which will degrade the LED performance.

It would be desirable to adequately accelerate the solder solidification speed to control the appearance of voids in the interface. It would also be desirable to avoid the annealing of LEDs which have already been bonded onto a heated substrate, leading to the degradation thereof.

SUMMARY OF THE INVENTION

It is thus an object of the invention to seek to provide a direct die attach method for die bonding which avoids at least some of the aforesaid shortcomings of prior art die bonding methods.

Accordingly, there is provided a method of bonding a die comprising a solder layer which has a melting point Tm, comprising the steps of: heating a bond head to a bond head setting temperature T1, which is higher than Tm; heating a substrate to a substrate setting temperature T2, which is lower than Tm; picking up the die with the bond head and heating the die towards temperature T1 so as to melt the solder layer; pressing the solder layer of the die onto the substrate so as to bond the die to the substrate; and thereafter separating the bond head from the die so that the solder layer is cooled towards T2 and solidifies.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a die bonding method according to the preferred embodiment of the invention will now be described with reference to the accompanying drawings, in which.

DETAILED DESCRIPTION OF THE PREFERRED EMBODIMENT OF THE INVENTION

Figure 1:
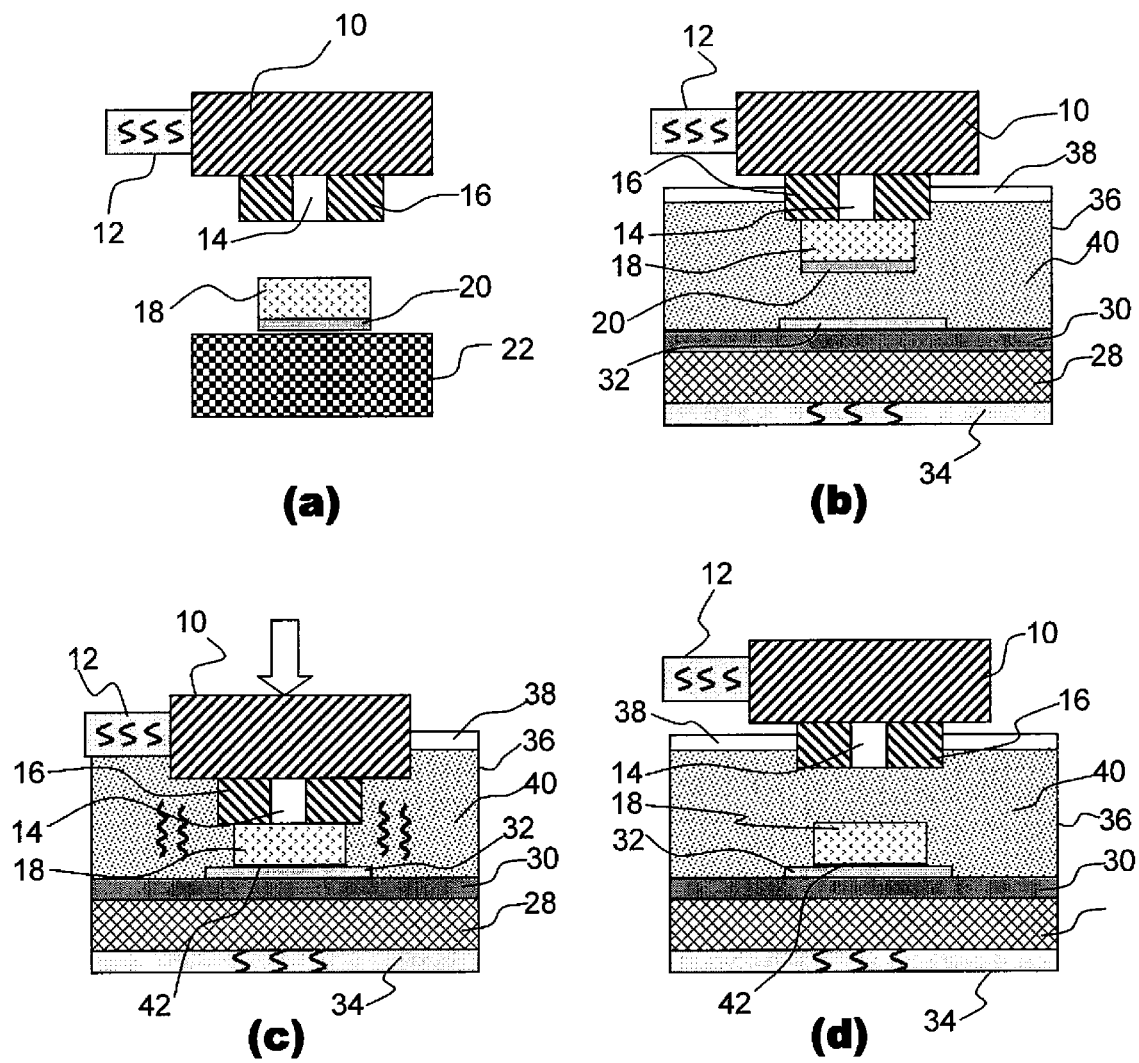
FIGS. 1(a) to 1(d) illustrate schematic side views of a die bonding operation according to the preferred embodiment of the invention successively demonstrating the process steps for mounting a die onto a substrate.

FIGS. 1(a) to 1(d) illustrate schematic side views of a die bonding operation according to the preferred embodiment of the invention successively demonstrating the process steps for mounting a die onto a substrate.

In FIG. 1(a), a bond head 10 is first heated to a bond head setting temperature, T1. The bond head 10 in the present embodiment has a heating element 12 and a vacuum system associated with it. The vacuum system (not shown) is used to maintain a negative pressure in the suction hole 14 of the die collet 16. The dimension of the suction hole 14 is less than the size of a die 18, which may be a High Brightness or other LED chip. Heat generated from the heating element 12 of the bond head 10 is conducted to the die collet 16 and subsequently to the die 18 when the bond head 10 is holding the die 18 by collet suction.

The die 18 comprises a solder layer, such as eutectic layer 20 at its bottom, which has a melting point Tm. The bond head setting temperature T1 is higher than the melting point Tm of the eutectic layer 20. Preferably, T1 is 5-50° C. higher than Tm. Thus, the bond head temperature for heating the die 18 may be set to 285-330° C. in order to melt a gold-tin eutectic layer 20, where the gold-tin eutectic layer typically has a melting temperature of about 280° C.

A pick arm will pick up the die 18 from an adhesive sheet, which may be a mylar paper on a wafer table. The die 18 is preferably mounted on the mylar paper with the eutectic layer 20 facing downwards. The pick arm then places the die 18 on a stage 22 so that the eutectic layer 20 faces downwards, without heating the die 18. The heated bond head 10 picks the die from the stage 22. The stage 22 is used as a medium to transfer the die 18 from the wafer table to the heated bond head 10. The heated bond head 10 should not touch the mylar paper directly, since the heat will damage the mylar paper which is supporting the wafer, and adversely affect the supporting structure of the other dice which have not been picked up. Alternatively, the pick arm can also be used to pick up the die 18 from a mylar paper on a wafer table, the die 18 being mounted with the eutectic layer 20 facing upwards. The pick arm then flips the die so that the eutectic layer 20 faces downwards and the heated bond head 10 picks the die 18 from the pick arm directly.

In FIG. 1(b), a substrate 30 is substantially enclosed within a chamber comprising a heat tunnel 36. The substrate 30 is heated to a substrate setting temperature T2, which is lower than the melting point Tm of the eutectic layer 20. Preferably, T2 is 5-50° C. lower than Tm. The temperature of an anvil block 28 for preheating the substrate 30 may thus be set at 230-275° C., which is lower than the gold-tin eutectic melting point of 280° C. This achieves two purposes: It serves to reduce high temperature annealing on the die 18 and hence, avoid degradation of the die 18 after bonding; another purpose is to achieve fast solidification of a bonding joint after separation of the heated bond head 10 from the die 18.

The preheating of the substrate 30 is necessary since the temperature of the eutectic layer 20 will decrease after die-attach onto the substrate's bond pad 32. Without preheating of the substrate 30, the quality of wetting at the bonding joint cannot be guaranteed, and the pressing time will be prolonged which will sacrifice the productivity of the bonding process. More importantly, the heated die 18 will experience thermal shock from coming into direct contact with the bond pad 32, if the bond pad 32 is at room temperature. This will result in failure of the LED chip. Heat generated from a heating element 34 underneath the anvil block 28 will be conducted to the substrate 30 and its bond pads 32. The substrate 30 could be a leadframe or any ceramics, silicon or plastics-based substrate or other substrates, and the bond pad 32 may comprise gold, silver, palladium or other metals.

In order to protect the substrate 30, the bond pad 32 and the eutectic layer 20 from oxidation, the bonding process is carried out in the heat tunnel 36 which is enclosed by a cover 38, and the whole chamber is filled with a shielding gas 40 such as nitrogen. Accordingly, the oxygen level is controlled below a certain level by the shielding gas 40 in the chamber of the heat tunnel 36.

The eutectic layer 20 of the die 18 should also be protected from oxidation in air after heating. There are various approaches to protect the die 18. Firstly, a blow nozzle for blowing shielding gas to the heated die 18 may be fastened onto the heated bond head 10. Therefore, the die 18 can be protected when it is being held by the heated bond head 10 until it moves into the protected environment of the heat tunnel 36 in which the substrate 30 is located, as shown in FIG. 1(b). Secondly, all the systems along the moving path of the heated die 18 may be designed such as to protect the die 18 with shielding gas 40, including the stage 22 or the position of the pick arm after flipping, and the moving path of the heated die 18 from the stage 22 or the position of the pick arm after flipping to the bond pads 32 of the substrate 30. Of course, the shape of the opening and the size of the heat tunnel 36 for movement of the bond head 10 along with the gas flow pressure should also ensure the effectiveness of protection against oxidation.

After heating of both the die 18 and the substrate 30 is completed, bonding can be performed. The melted eutectic layer 20 of the heated die 18 is pressed down by the bond head 10 onto the substrate pad 32 of the substrate 30. The bond head 10 continues pressing downwards until a preset bonding force is achieved, as shown in FIG. 1(c), and the bonding force is then maintained for a preset time.

The molten gold-tin eutectic layer 20 reacts fully with the material of the bond pad 32, that is the gold-tin material spreads to wet on the bond pad 32, and the bond pad 32 material dissolves into the molten gold-tin eutectic material. After a preset bonding time has passed, the bond head 10 will be separated from the die 18 surface, as shown in FIG. 1(d). Now, without heating from the bond head 10, the temperature of the solder/bond pad interface or bonding joint 42 will decrease quickly towards the substrate 30 preheat temperature T2, which is lower than the melting point Tm of the gold-tin eutectic layer 20. As a result, the solder at the bonding point 42 cools and solidifies quickly and forms a robust bond without voids.

Figure 2:
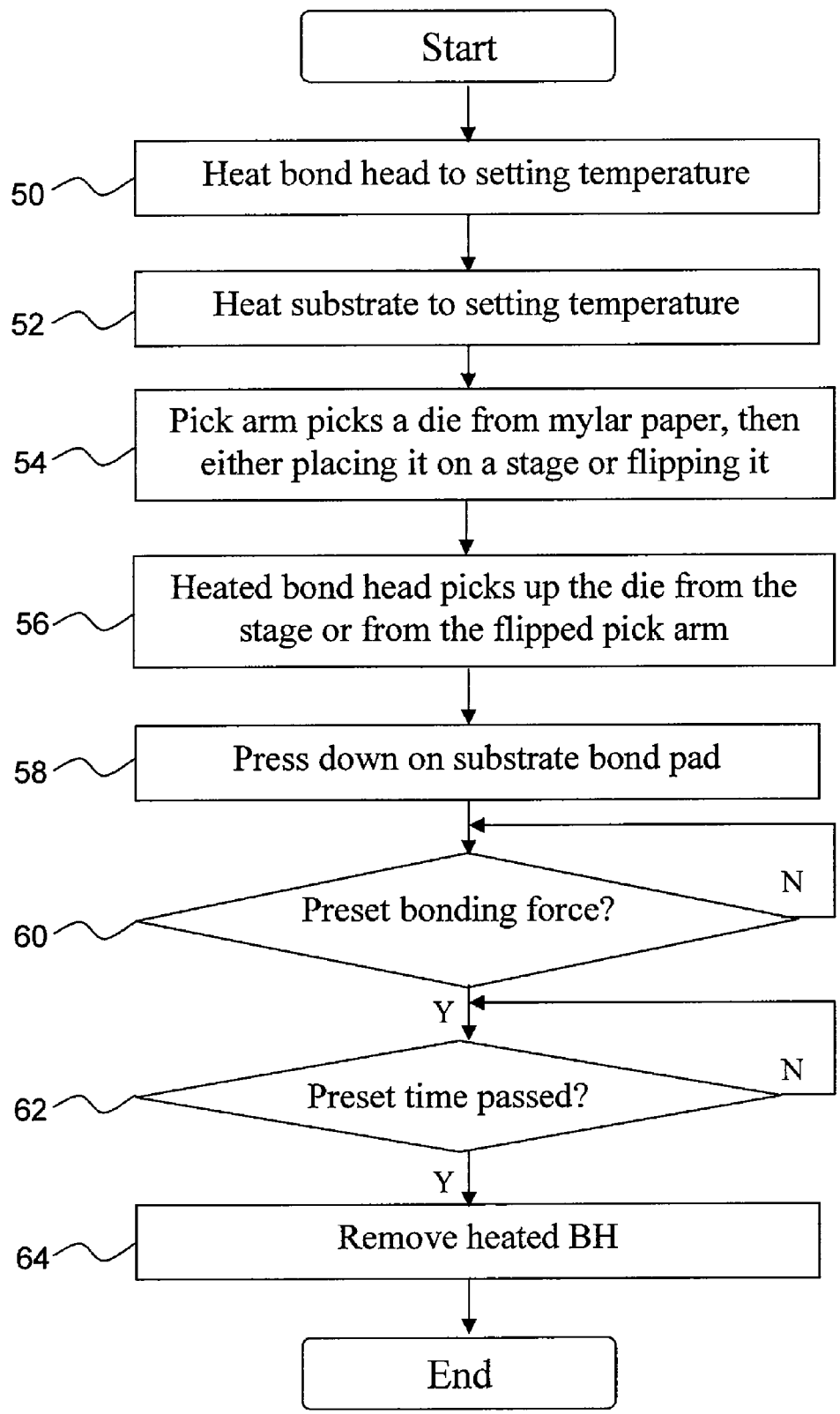
FIG. 2 is a flow chart of the control steps involved in the direct die bonding operation according to the preferred embodiment of the present invention.

FIG. 2 is a flow chart of the control steps involved in the direct die bonding operation according to the preferred embodiment of the present invention. The bond head is first heated to a bond head setting temperature 50, which is higher than the melting point of the eutectic material. The substrate is also heated to a substrate setting temperature 52, which is lower than the melting point of the eutectic layer. The pick arm picks up a die with the eutectic layer facing downwards from mylar paper from which the die has been mounted, and places it on the stage 54. Alternatively, the pick arm picks up a die with the eutectic layer facing upwards from mylar paper from which the die has been mounted, and flips it so that the eutectic layer faces downwards 54. Thereafter, the heated bond head picks up the die from the stage or directly from the flipped pick arm with the eutectic layer facing downwards 56.

The bond head then moves the die to the position of the substrate, and presses the die onto the bond pad of the substrate 58. The bond head will detect whether a preset bonding force has been reached 60, and whether a preset time has passed 62. If so, the die has been bonded to the substrate, and the heated bond head is removed or separated from the die 64.

Figure 3:
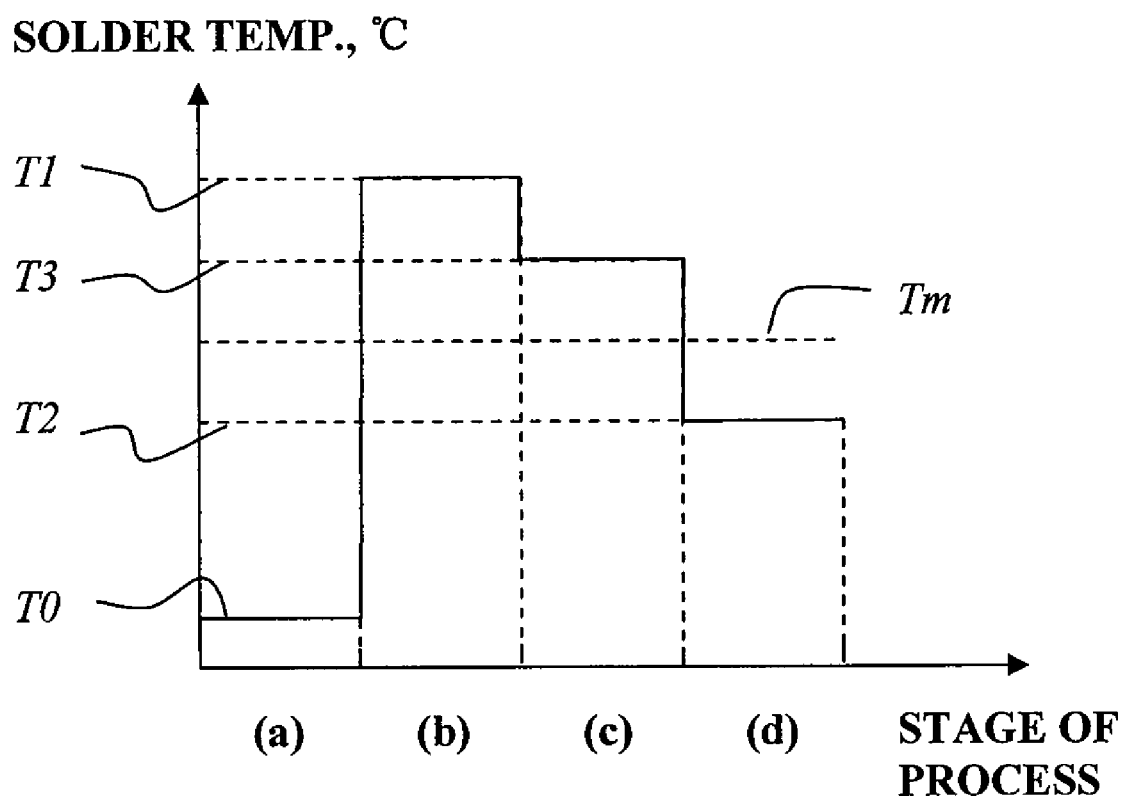
FIG. 3 is a graph showing various temperatures of the gold-tin eutectic layer during the different process steps as described in FIG. 1 and FIG. 2.

The temperature of the die 18 and its gold-tin eutectic layer 20 is strictly controlled during the heated bond head bonding process. FIG. 3 is a graph showing various temperatures of the gold-tin eutectic layer during the different process steps as described in FIG. 1 and FIG. 2. When the pick arm picks up a die 18 from mylar paper and places it on the stage 22 or flips it, the die's eutectic layer is at room temperature, T0 (approximately 25° C.) without thermal conduction to the die 18. After the heated bond head 10 holds the die 18 and moves it to the heat tunnel 36 where the substrate 30 is located, the eutectic layer 20 is heated up quickly to the preset temperature, T1 (approximately 285-330° C.) of the heated bond head 10 during its holding duration. The eutectic layer 20 melts fully during this period.

However, after the die 18 touches the bond pad 32 of the substrate 30 and is pressed down on the bond pad, the interface temperature will decrease to a temperature T3, which is higher than the melting point (Tm, which is about 280° C.), and still good enough for bonding (between the bond head temperature T1 and the substrate temperature T2 of approximately 230-275° C.) due to heat conduction. As soon as the bond head 10 and the die 18 are separated, the temperature of the bonding joint 42 will decrease quickly towards the substrate 30 temperature T2 (approximately 230-275° C.) and the solder in the bonding joint 42 solidifies quickly. The substrate temperature T2, which is lower than the melting point Tm of the eutectic layer 20, prevents annealing of the bonded die 18 while further dice are being bonded onto the substrate 30.

This invention is not limited to gold-tin eutectic solder bonding only. Other solder materials can also be used. Further, the invention is not limited to LED chips as described and illustrated above. Other devices can also be bonded using the heated bond head direct eutectic bonding process according to the preferred embodiment of the invention.

The novel direct eutectic die attachment method as described is especially advantageous when applied to HBLED chip bonding, as it is beneficial for lowering the substrate heating temperature in order to reduce the chip heating effect after the die 18 has been bonded onto the substrate, hence avoiding LED chip degradation. Moreover, the bond quality is improved by fast solidification of the eutectic layer, and the solder flow-back behavior observed in relation to prior art direct die bonding is constrained effectively.

Bonding performance is enhanced due to the avoidance of voids, greater bond coverage and the reduction of die tilting. Furthermore, there is good thermal and electrical conduction, and improved process variability of bond line thickness. The enhanced characteristics of the bonding interface and bonding joint, and reduced chip degradation effectively improve the bonding reliability.

The invention described herein is susceptible to variations, modifications and/or additions other than those specifically described and it is to be understood that the invention includes all such variations, modifications and/or additions which fall within the spirit and scope of the above description.

The invention claimed is:

1. Method of bonding a die comprising a solder layer which has a melting point Tm, comprising the steps of:

heating a bond head to at least a bond head setting temperature T1, which is higher than Tm;
heating a substrate to a substrate setting temperature T2, which is lower than Tm;
picking up the die with the heated bond head and heating the die with the heated bond head to at least T1 so as to melt the solder layer thereof;
placing the die on the substrate after melting the solder layer by heating the die with the heated bond head;
pressing the molten solder layer of the die onto the substrate so as to bond the die to the substrate; and thereafter separating the bond head from the die so that the solder layer is cooled to at least T2 and solidifies.

2. Method as claimed in claim 1, wherein the bond head setting temperature T1 is 5-50° C. higher than Tm.

3. Method as claimed in claim 2, wherein the substrate setting temperature T2 is 5-50° C. lower than Tm.

4. Method as claimed in claim 1, wherein during the step of pressing the die onto the substrate, the temperature of the die decreases to T3, which is between T1 and Tm.

5. Method as claimed in claim 1, wherein the melting point Tm of the solder layer is about 280° C.

6. Method as claimed in claim 1, further comprising the steps of first mounting the die on an adhesive sheet with its solder layer facing downwards, and then picking up the die with a pick arm and placing it on a stage, before the step of picking up the die from the stage with the bond head.

7. Method as claimed in claim 6, wherein the die is placed on the stage by the pick arm with its solder layer facing downwards.

8. Method as claimed in claim 1, further comprising the steps of first mounting the die on an adhesive sheet with its solder layer facing upwards, and then picking up the die with a pick arm which flips the die so that its solder layer faces downwards, before the step of picking up the die from the pick arm with the bond head.

9. Method as claimed in claim 1, wherein the substrate is substantially enclosed within a chamber comprising a heat tunnel.

10. Method as claimed in claim 9, wherein the heat tunnel is enclosed by a cover, and the chamber is filled with a shielding gas for preventing oxidation of the solder layer and the substrate.

11. Method as claimed in claim 1, further comprising the step of blowing a shielding gas onto the die when it is being held by the heated bond head for preventing oxidation of the solder layer.

12. Method as claimed in claim 1, wherein the die is pressed onto the substrate at a preset bonding force for a preset time.

13. Method as claimed in claim 1, wherein the solder layer comprises a gold-tin material.

14. Method as claimed in claim 1, wherein the die comprises a high-brightness LED chip.

* * * * *